(12) United States Patent
Masleid et al.

(10) Patent No.: US 8,525,550 B2
(45) Date of Patent: Sep. 3, 2013

(54) REPEATER CIRCUIT WITH MULTIPLEXER AND STATE ELEMENT FUNCTIONALITY

(76) Inventors: Robert P. Masleid, Monte Sereno, CA (US); Anand Dixit, Mountain View, CA (US)

(*) Notice: Subject to any disclaimer, the term of this patent is extended or adjusted under 35 U.S.C. 154(b) by 510 days.

(21) Appl. No.: 12/908,167

(22) Filed: Oct. 20, 2010

(65) Prior Publication Data

US 2012/0099622 A1   Apr. 26, 2012

(51) Int. Cl.
*H03K 19/096* (2006.01)
*H04B 3/36* (2006.01)

(52) U.S. Cl.
USPC ............. 326/97; 326/82; 326/93; 326/96; 327/161; 375/211; 340/309.9

(58) Field of Classification Search
USPC ..... 326/21, 23, 26, 27, 82, 93; 327/108–113; 340/309.9; 375/211
See application file for complete search history.

(56) References Cited

U.S. PATENT DOCUMENTS

| | | | |
|---|---|---|---|
| 6,426,652 B1 * | 7/2002 | Greenhill et al. | 326/83 |
| 6,731,140 B2 * | 5/2004 | Masleid et al. | 327/99 |
| 7,071,747 B1 | 7/2006 | Masleid | |
| 7,119,580 B2 | 10/2006 | Masleid | |
| 7,256,634 B2 | 8/2007 | Masleid | |
| 7,724,027 B2 * | 5/2010 | Rozas et al. | 326/38 |
| 7,880,513 B2 | 2/2011 | Masleid | |
| 8,063,673 B2 * | 11/2011 | Masleid | 327/112 |
| 8,330,588 B2 * | 12/2012 | Dixit et al. | 340/309.9 |
| 2010/0164447 A1 | 7/2010 | Masleid | |
| 2010/0164556 A1 | 7/2010 | Masleid | |
| 2010/0164557 A1 | 7/2010 | Masleid | |
| 2010/0164576 A1 | 7/2010 | Masleid | |

* cited by examiner

*Primary Examiner* — Shawki Ismail
*Assistant Examiner* — Nelson Correa
(74) *Attorney, Agent, or Firm* — Meyertons, Hood, Kivlin, Kowert & Goetzel, P.C.; Erik A. Heter

(57) ABSTRACT

A circuit implementing multiplexer, storage, and repeater functions is disclosed. The circuit includes first and second input stages having first and second data inputs, respectively. An output stage is configured to drive an output signal. The first input stage is configured to activate the output stage responsive to a first condition, while the second input stage is configured to activate the output stage responsive to a second condition. An intermediate stage is configured to deactivate the output stage at a first delay time subsequent to one of the first or second input stages activating the output stage. The repeater circuit also includes a storage element configured to store a state of the output signal, and further configured to cause the output node to be held at the state of the output signal subsequent to deactivation of the output stage.

20 Claims, 6 Drawing Sheets

REPEATER CIRCUIT WITH MULTIPLEXER AND STATE ELEMENT FUNCTIONALITY

BACKGROUND

1. Field of the Invention

This invention relates to electronic circuits, and more particularly, to repeater circuits.

2. Description of the Related Art

As integrated circuit (IC) technology advances, the speeds at which IC's operate increases while operating voltages generally decrease. As such, the distances at which signals must propagate on a die become an increasingly important factor to consider in IC design. At longer distances, on-die interconnects between a transmitter and a receiver can develop enough resistance and enough capacitance that the signal transition at the receiver can be adversely affected. Excessive propagation delay across a long signal interconnect can affect the transition at the receiver in terms of both timing and voltage levels. For example, a signal that propagates too slowly across an interconnect may in some cases not allow sufficient set-up and hold time for the receiver to properly transition from one logic level to another. Furthermore, a slow transition can cause crowbar currents in some receivers, which can lead to increased power consumption and may further lead to circuit damage in more severe cases.

In order to combat the negative effects of long signal interconnects, repeater circuits may be implemented. More particularly, repeater circuits may be placed along a signal path between a transmitter and receiver, effectively breaking a single interconnect into two or more interconnects. In such a configuration, repeater circuits may overcome some of the problems of resistance and capacitance that would be present in a single signal interconnect, and may further cause faster transition times at the receiver.

Repeater circuits may be simple or complex. The simplest interconnect circuits may be implemented using an inverter, with a double inverter (i.e. a buffer) being an alternative if no logical inversion is desired. FIG. 1 is a schematic diagram of a more complex repeater circuit. In the embodiment shown, repeater circuit 200 may change the state of a signal on its output node ('Out') responsive to a change on its input node ('In'). The input signal may propagate through weak keeper 205 to the output node. The output signal may also be driven on the output node by output circuit 225. For example, if the input signal transitions from a low to a high, transistor N201 is activated, and a pull-down path is provided between node dp and ground through N201 and N202. As a result, P203 is activated and drives the output node high. After a delay time determined equal to the propagation delay through delay circuit 210, transistor N202 may be deactivated while transistor P202 is activated, pulling node dp high. A high-to-low transition of the input signal may occur in a similar manner, with N206 driving the output node low until turned off via the feedback path through delay circuit 210.

The use of repeater circuit 200 may provide certain advantages over simpler repeater circuits, such as the aforementioned buffers and inverters. For example, repeater circuit 200 may be less susceptible to crowbar currents than a buffer or an inverter. Furthermore, power consumption may be reduced, since the two output devices (which are typically much larger than other devices in the circuit) are not active at the same time, thereby preventing crowbar power consumption. Instead, the output devices may provide sufficient drive to overcome the resistance and capacitance inherent in the signal interconnect long enough to enable a timely transition at the receiver, and then turned off once the output is present on the output of weak keeper 205.

In some cases, the length of a signal path between two points on an IC die may have a propagation time that is longer than a clock cycle at which the IC operates. Accordingly, it may be necessary to store the state of the transmitted signal across a clock boundary. One solution for such a situation is to use a flip-flop, rather than using a repeater circuit.

SUMMARY OF THE DISCLOSURE

A circuit implementing multiplexer, storage, and repeater functions is disclosed. In one embodiment, the circuit includes first and second input stages having first and second data inputs, respectively. An output stage is configured to drive an output signal. The first input stage is configured to activate the output stage responsive to a first condition, while the second input stage is configured to activate the output stage responsive to a second condition. An intermediate stage is configured to deactivate the output stage at a first delay time subsequent to one of the first or second input stages activating the output stage. The repeater circuit also includes a storage element configured to store a state of the output signal, and further configured to cause the output node to be held at the state of the output signal subsequent to deactivation of the output stage.

An integrated circuit (IC) is also disclosed. In one embodiment, the IC includes a first transmitter configured to drive a first signal on a first signal path and a second transmitter configured to drive a second signal on a second signal path. The IC further includes a clock generation circuit, wherein the clock generation circuit is configured to selectively enable one of a first clock signal associated with the first transmitter and a second clock signal associated with the second transmitter. The IC further includes at least one repeater circuit. The repeater circuit includes a first input stage coupled to receive the first signal from the first signal path and a second input stage coupled to receive the second signal from the second signal path. The repeater circuit further includes an output stage configured to, when active, drive an output signal on an output node, wherein the first input stage is configured to activate the output stage responsive to a transition of the first clock signal, and wherein the second input stage is configured to activate the output stage responsive to a transition of the second clock signal. An intermediate stage of the repeater circuit is coupled to the output stage. The intermediate stage is configured to deactivate the output stage at a first delay time subsequent to one of the first or second input stages activating the output stage. The repeater circuit also includes a storage element configured to store a state of the output signal, and further configured to cause the output node to be held at the state of the output signal subsequent to deactivation of the output stage.

BRIEF DESCRIPTION OF THE DRAWINGS

Other aspects of the invention will become apparent upon reading the following detailed description and upon reference to the accompanying drawings in which.

Figure 1:
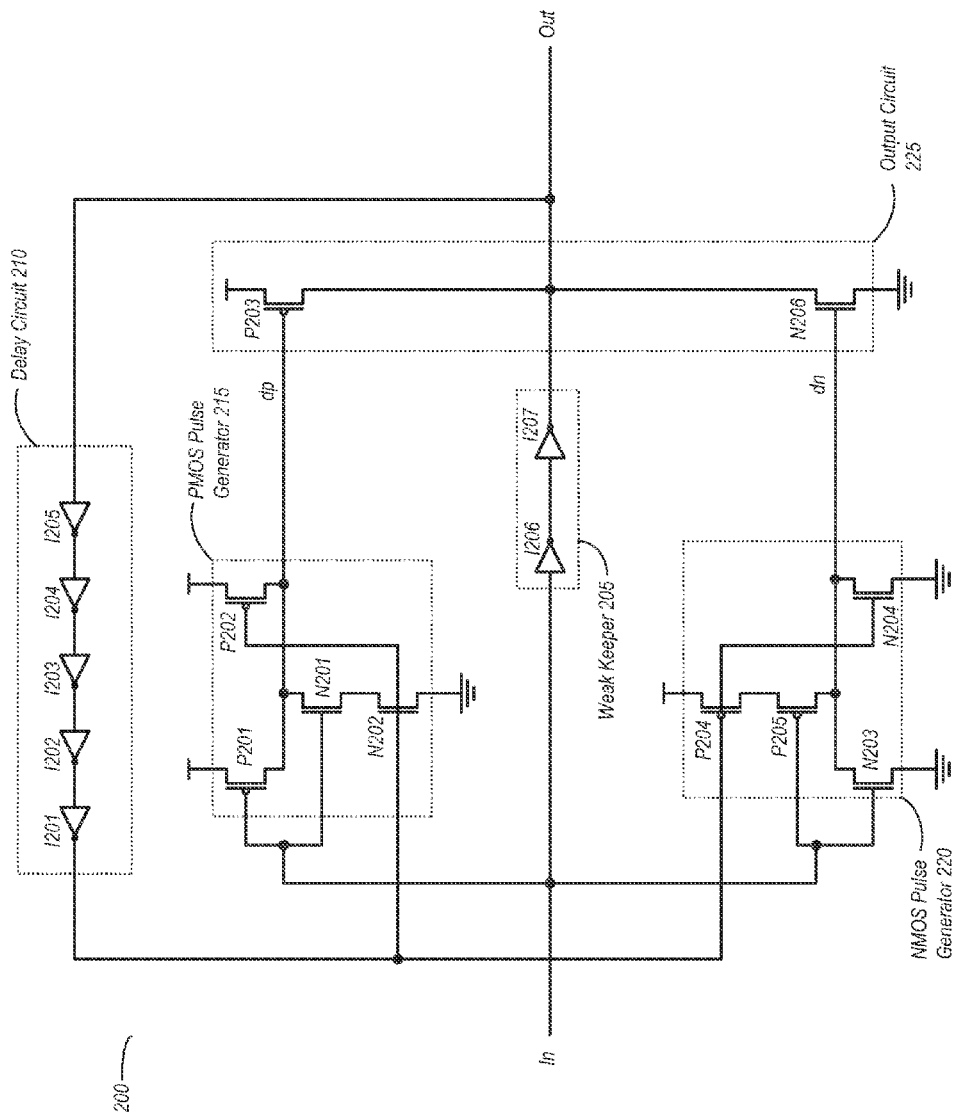
FIG. 1 (Prior Art) is a schematic diagram of one embodiment of a repeater circuit.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling within the spirit and scope of the present invention as defined by the appended claims.

DETAILED DESCRIPTION

The present disclosure is directed to a circuit that combines the functionality of a multiplexer, a state element (i.e. a storage element) and a repeater circuit. In one embodiment, the circuit includes at least two input stages, an output stage, an intermediate stage, and a storage element. When a particular one of the input stages is active to receive a signal from a respectively coupled signal line, the other input stages may be inhibited from receiving signals from their respectively coupled signal lines. The output stage may drive an output signal on an output node responsive to an input signal on the selected one of the input stages. In one embodiment, signal received by a selected one of the input stages may be provided to the output node with only two inversions.

The circuit may also include an intermediate stage coupled between the input stages and the output stage in order to enable dynamic operation. When a selected one of the input stages receives a signal, it may cause the activation of the output stage. The active stage may be defined as being active when one of its respective devices is active and driving an output node. A delay circuit may be coupled between the output node and the intermediate stage. The delay circuit may be coupled to receive and feed back the output signal to the intermediate stage. The intermediate stage may receive the delayed version of the output signal. Responsive to receiving the delayed version of the output signal, the intermediate circuit may cause the deactivation of the output stage. Accordingly, the circuit may function as a dynamic repeater circuit.

As noted above, the circuit may include two or more input stages, and may be configured to provide the functionality of a multiplexer. An input stage may be defined as active when it is enabled to activate the output stage responsive to receiving a signal from its respective signal line. When a particular one of the input stages is active, other ones of the input stages may be inhibited from activating the output stage based on signals received on their respective input nodes. Selection of a particular one of the input stages for activation may be accomplished through one or more external signals. In one embodiment, each input stage may be coupled to receive a corresponding clock signal that is unique with respect to respective clock signals received by other ones of the input stages. A particular input stage may be enabled to activate the output stage responsive to a clock edge of its respectively received clock signal. Clock signals corresponding to other input stages may be inhibited. In other embodiments, a select signal may be used. However, using clock signals as discussed above may remove the selection circuitry from the data path, and may thus enable faster circuit operation.

The circuit may also implement a storage function in which the state of a most recently received input signal (and state of a corresponding output signal) is held by a state element in the circuit subsequent to deactivation of the output stage. The storage circuit may be configured to change the stored state responsive to an input stage change of a selected one of the input stages. After the output circuit is deactivated, the storage circuit may continue to provide the responsive state on the output. The implementation of the state element functionality in the circuit may make the circuit useful in signal paths wherein the signal transit time exceeds the cycle time of a corresponding clock signal. An exemplary embodiment of a circuit that implements multiplexer, state element, and repeater functionality will now be discussed in further detail.

Figure 2:
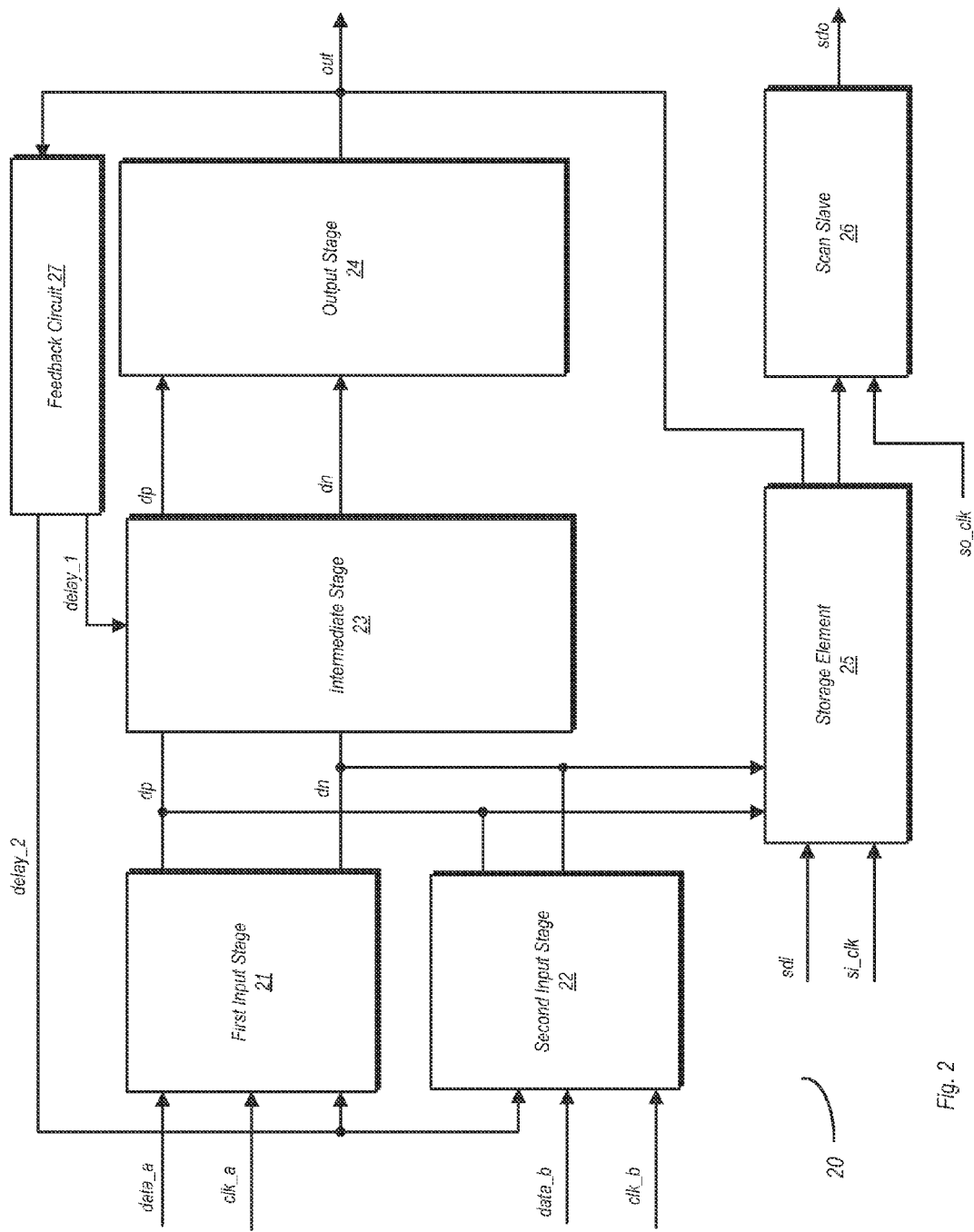
FIG. 2 is a block diagram of one embodiment of a circuit combining the functions of a multiplexer, a state element, and a repeater.

Repeater Circuit Implementing Multiplexer and State Element Functionality:

Turning now to FIG. 2, a block diagram of one embodiment of a dynamic repeater circuit that includes multiplexer and a storage element. In the embodiment shown, circuit 20 includes a first input state 21, a second input stage 22, an intermediate stage 23, an output stage 24, storage element 25, scan slave 26, and feedback circuit 27. It is noted that scan slave 26 is optional, and thus may not be included in all embodiments. Nevertheless, circuit 20 as shown in this embodiment supports scan testing.

First input stage 21 in the embodiment shown is configured to receive a first signal on its data input, data_a, and a first clock signal on its clock input, clk_a. Second input stage 22 is coupled to receive a second data signal on its data input, data_b, and a second clock signal on its clock input, clk_b. Both of the input stages shown are coupled to intermediate stage 23 via intermediate nodes dp and dn. A multiplexer function may be implemented in circuit 20 by enabling one of the first or second input stages. First input state 21 may be enabled if the first clock signal is active (i.e. alternating between low and high states), while second input stage 22 may be enabled if the second clock signal is active. Circuitry external to circuit 20 (an example of which will be discussed below) may be configured to activate a particular one of the clock signals in order to select a corresponding input signal to be received by the circuit, while inhibiting the other clock signal. It is noted that while the embodiment shown includes only two input stages, embodiments are possible and contemplated wherein more than two input stages are included.

When a signal state change occurs on the data input of a selected one of the input stages, a corresponding state change may occur on at least one of the intermediate nodes dp and dn. The state change of the intermediate nodes may be synchronized with the corresponding clock signal, and more particularly, when that clock signal changes state. For example, if clk_a is active (and thus first input stage 21 is selected), a low-to-high transition of a signal received on data_a may be reflected on intermediate node dp when the clock signal transitions from low to high. In general, a particular input stage may be responsive to an edge of a clock signal. The edge to which an input stage is responsive may positive-going or negative going depending on the particular embodiment.

When a received input signal causes a state change of one of intermediate nodes dp and dn, output stage 24 may be activated responsive thereto. When output stage 24 becomes active, the output node ('out') may change states. As will be discussed below, output stage 24 may be defined as active when one of its respective devices (e.g., transistors) is active and driving a signal onto the output node. The output signal driven on the output node may be received as an input signal by feedback circuit 27. Responsive to the change of state of the output signal, feedback circuit 27 may provide a first feedback signal to intermediate stage 23, via node delay_1. Responsive to receiving the first feedback signal, intermediate stage 23 may cause output stage 24 to be deactivated. Feedback circuit 27 is also configured to provide a second feedback signal to the input stages via node delay_2. Responsive to receiving the second feedback signal, and active input stage may be inhibited from continuing to drive at least one of intermediate nodes dp and dn.

In the embodiment shown, storage element 25 is coupled to intermediate nodes dp and dn, and is also coupled to the output node. Storage element 25 is configured to capture a change of state to the output resulting from a change of state on the data input of an active one of the input circuits. In addition, storage element 25 may store the new state and cause the state to be held on the output node after deactivation of output circuit 24.

Circuit 20 in the embodiment shown is configured to support scan testing. Accordingly, storage element 25 in the embodiment shown is configured to receive scan data through a scan data input, sdi, and is further configured to receive a scan input clock through the input si_clk. During scan shifting operations, scan data may be received into storage element 25 synchronous with the scan input clock. Data corresponding to the received scan data may be provided to scan slave 26. In the embodiment shown, scan slave 26 is coupled to receive the corresponding data from storage element 25, and is further coupled to receive a scan output clock on the input so_clk. During scan shifting operations, data may be received into scan slave 26 synchronous with the scan output clock. In the embodiment shown, the scan input clock and scan output clock may pulse on opposite cycles. In addition to being able to shift scan data, storage element 25 and scan slave 26 in the embodiment shown also operate to test result data, while storage element 25 is also able to provide test stimulus data to the output of circuit 20. Additional details of the circuitry enabling scan testing will be discussed below.

Figure 3:
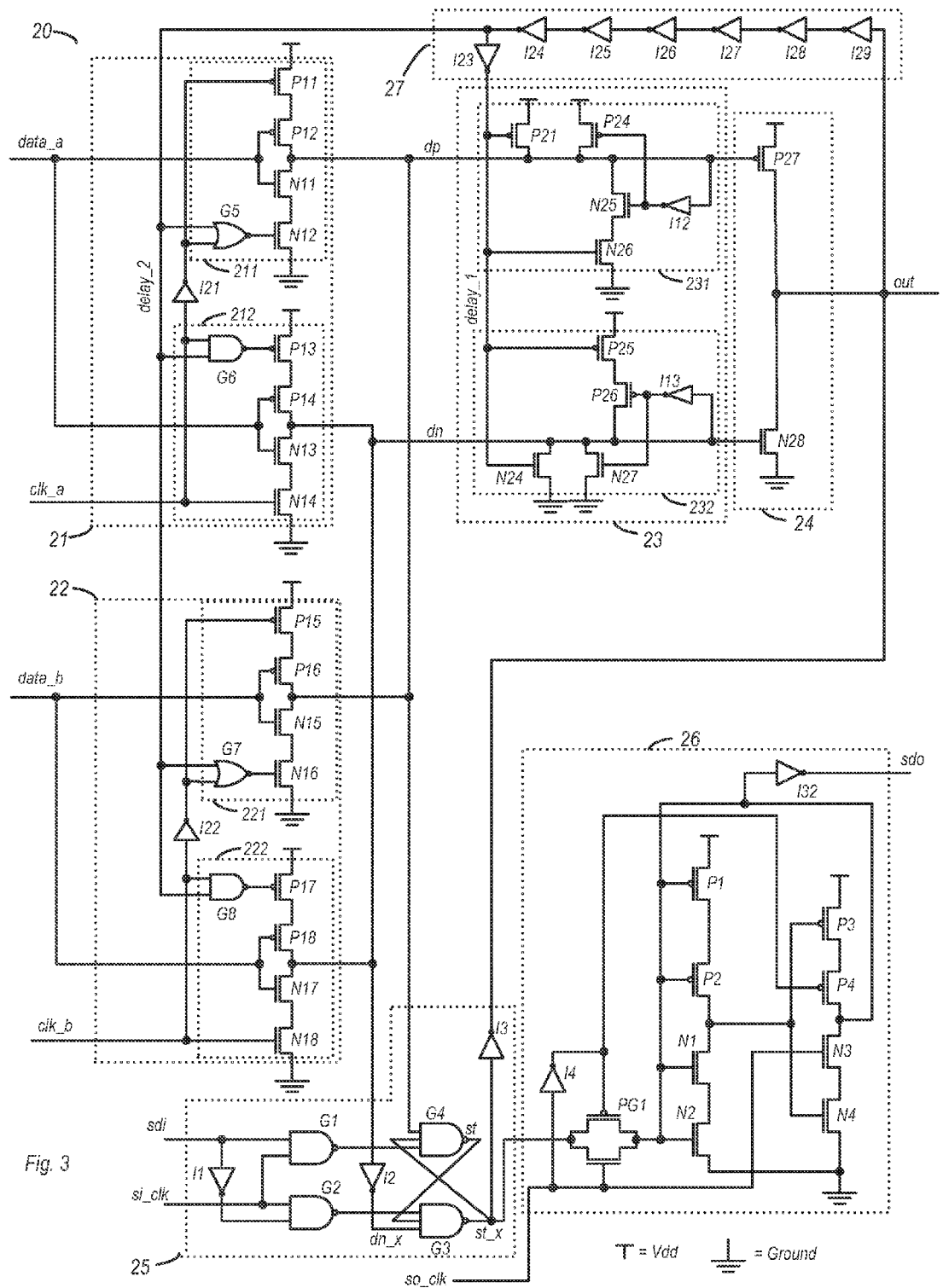
FIG. 3 is a schematic diagram of one embodiment of a circuit implementing a multiplexer, a state element, and a repeater.

Turning now to FIG. 3, a schematic diagram illustrating an embodiment of circuit 20 in detail is shown. As with the embodiment shown in FIG. 2, circuit 20 as illustrated in FIG. 3 includes a first input circuit 21, a second input circuit 22, an intermediate circuit 23, and output circuit 24, storage element 25, scan slave 26, and feedback circuit 27.

In the embodiment shown, first input circuit 21 includes gated inverters 211 and 212, while second input circuit 22 includes gated inverters 221 and 222. Respective outputs of gated inverters 211 and 221 are coupled to intermediate node dp, while respective output of gated inverters 212 and 222 are coupled to intermediate node dn. These inverters may be gated according to a respectively received clock signal. Gated inverters 211 and 212 of first input circuit 21 are configured to enable operation when a first clock signal, received via clk_a, is high. Gated inventers 211 and 212 may be disabled when the first clock signal is low. Thus, when the first clock signal is high, gated inverter 211 may drive node dp to a state that is opposite of the state of a signal on its data input, data_a. Similarly, gated inverter 212 may drive node dn to a state that is opposite of the state of the signal on data_a when the first clock signal is high. When the first clock signal is low (either on the low portion of its active cycle, or inhibited), neither of inverters 211 or 212 are enabled to drive nodes dp and dn, respectively. Accordingly, when the first clock signal is low (and inverters 211 and 212 thus inhibited), changes of a logical state on data_a are not reflected on either of nodes dp or dn.

In the embodiment shown, first input circuit 21 and second input circuit 22 each include a pair of logic gates (one NOR gate and one NAND gate) as well as an inverter arranged to invert their respectively received clock signal. With respect to first input circuit 21, the first clock signal as provided to inverter 211 is inverted by inverter I21, and thus a low is received when the first clock signal is high. When the first clock signal is high (and thus the output of I21 is low), a low is received on the gate terminal of P11 and as an input to NOR gate G5 (the output of which is coupled to the gate terminal of N12. The other input of G5 is coupled to node delay_2, which is coupled to provide a delayed equivalent of the output signal (present on the output node) via feedback circuit 27. If the output signal from a previous cycle (still present on the output node) is a logic low (e.g., a logic 0), then both inputs to G5 are low and thus its output is high, thereby enabling N12. If data currently received on data_a is a logic high (e.g., a logic 1), then the gate terminal of N11 (which is coupled to data_a) is correspondingly high, and this device may be enabled as well. When both N11 and N12 are enabled, a pull-down path is provided between node dp and ground. Accordingly, the activation of both N11 and N12 may pull node dp low. Similarly, when the input signal received on data_a is high and the first clock signal is also high, both N13 and N14 will be active, and thus a second pull-down path is provided between node dn and ground through N13 and N14.

Transistors P11 and P12 of inverter 211 may become active when a low appears on data_a concurrent with the first clock signal transitioning high (and thus the output of I21 falling low). When a low is present on the input node while the output of I21 is also low, lows are thus present on both P11 and P12, and thus these devices are active. Node dn may also be pulled high when a low is present on respective gate terminals of P13 and P14. A low on data_a may be received directly on the gate terminal of P14. A low may be received on the gate terminal of P13 when both inputs to G6 are high. A first of these inputs is connected directly to clk_a, and thus is high when the first clock signal is high. The other input to G6 is coupled to delay_2, and is thus high when this node is high.

Gated inverters 221 and 222 of second input circuit 22 may operate in the same manner as described above with respect to the gated inverters 211 and 212 of first input circuit 21. However, gated inverters 221 and 222 in the embodiment shown operate in accordance with a second clock signal received via the clk_b input, and based upon data received via the data_b input.

Additional aspects of the operation of circuit 20 will now be explained in conjunction with the timing diagram of FIG. 4. The example shown in FIG. 4 begins with the first clock signal active and being received on clk_a, with the second clock signal being inhibited. The second half of the example proceeds with the second clock signal active and being received on clk_b while the first clock signal is inhibited. It is noted that in this particular example, the clock signals are based on pulses, and thus have less than a 50% duty cycle. However, embodiments are possible and contemplated wherein the clock signals do have a 50% (or greater) duty cycle.

Figure 4:
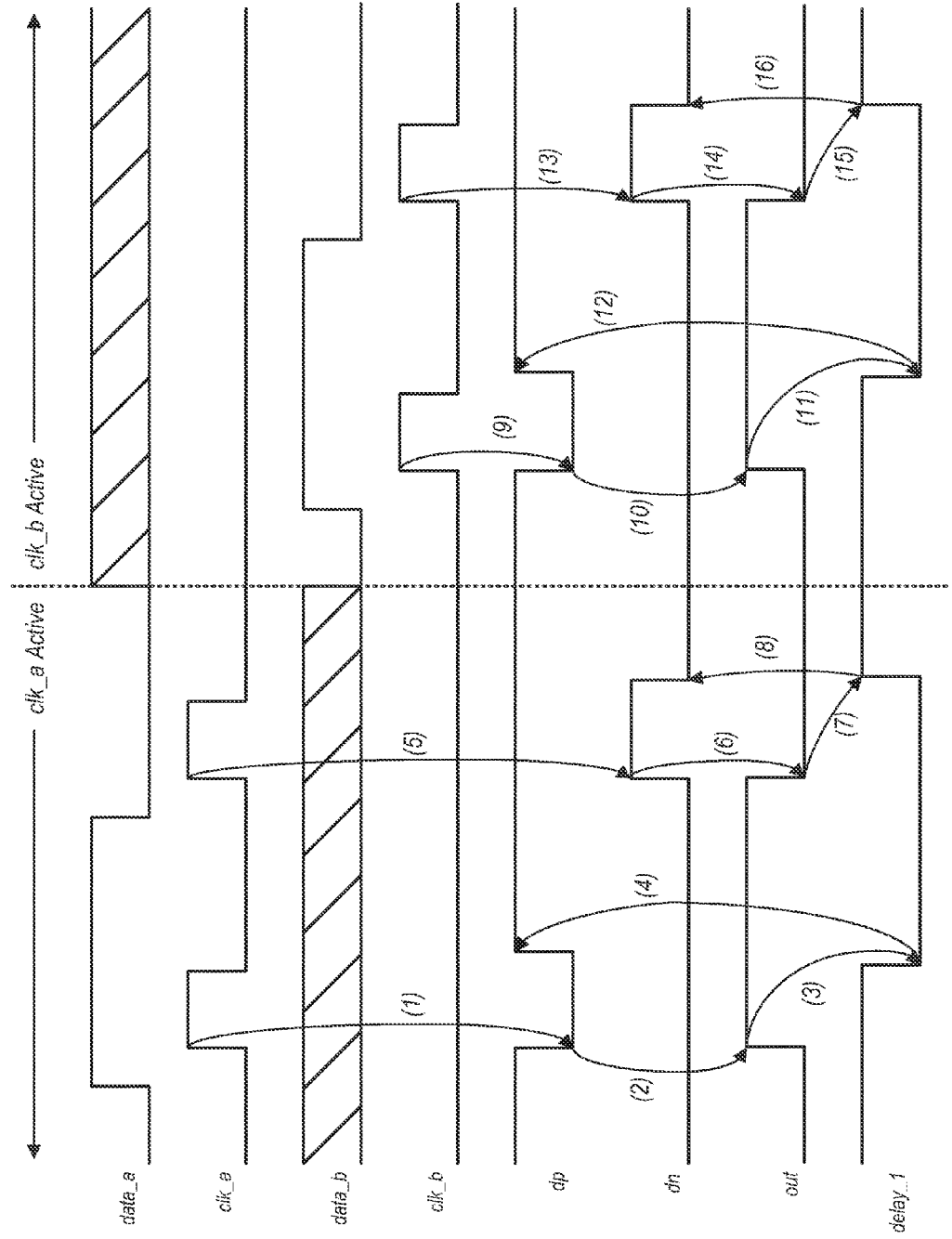
FIG. 4 is a timing diagram illustrating operation of one embodiment of a circuit configured to implement a multiplexer, a state element, and a repeater.

The example given in FIG. 4 begins with the output node and the input data node data_a of first input stage 21 both being low. Furthermore, since the second clock signal is inactive (held low in this example), the state of data_b (i.e. the input node to second input stage 22) is irrelevant at this point, and is thus illustrated in FIG. 4 as being indeterminate.

Prior to the first low-to-high transition of the first clock signal on clk_a, the data signal received on data_a undergoes a low-to-high transition. Subsequently, at (1), the first clock signal transitions high. As a result of the first clock signal transitioning high, N11 and N12 both become active, and thus intermediate node dp is pulled low. The resultant low on dp is received on the gate terminal of P27 of output stage 24. Responsive thereto, at (2), P27 is activated and thus the output node is pulled high via the pull-up path between the output node and Vdd. When P27 is active, the output node is pulled high. At approximately the same time, transistors N13 and N14 are also activated, providing a pull-down path between node do and ground, and thus preventing the activation of N28.

It is noted that devices of output stage 24, P27 and N28, may be significantly larger (e.g., having larger gate widths) than the other transistors in circuit 20. This may in turn allow these devices to provide the necessary drive strength to drive a signal down a long signal line to another repeater or to its intended recipient. Furthermore, these devices may be implemented with enough drive strength to over-drive other devices in the circuit should a contention arise. For example, P27 and N28 may be implemented with a drive strength sufficient to override the output of inverter I3 should these devices have conflicting states during a transition.

The low on dp is also propagated to the input of inverter I12 of keeper 231. Responsive to this low, I12 outputs a high, which is received on the gate terminal of N25. Since delay_1 is high at the time when dp is pulled low, N26 is also active. Accordingly, a second pull-down path is provided between dp and ground. The high on delay_1 also results in the activation of N24 of keeper 232, thereby providing a second pull-down path between node do and ground.

When the output node transitions from low to high, the resultant high is input into delay circuit 27 (which includes inverters I23-I29). The output signal is received at the input of inverter 29. A delayed complement of the output signal may be provided from the output of I23 (on delay_1), while a delayed signal that is logically equivalent to the output signal may be provided from the output of I24 (on delay_2). Accordingly, responsive to a low-to-high transition, delay circuit 27 may provide a complement of the output signal at a first delay time subsequent to the transition of the output node, and may provide a logically equivalent delayed signal (i.e. a delayed version of the output signal) at a second delay time subsequent to the transition of the output node. At (3), delay_1 falls low at the first delay time subsequent to the low-to-high transition of the output node. Delay_1 is coupled directly to the gate terminal of P21, and thus this device becomes active responsive to the low output from I23. When P21 is activated, at (4), node dp is pulled high again. When node dp is pulled high, P27 is deactivated, and thus output circuit 24 is no longer active for that cycle. The high on P21 also propagates to the input of inverter I12 of keeper 231, which responds by outputting a low. The low is received on the gate terminal of P24, which in turn provides a second pull-up path between node dp and Vdd. The low on delay_1 is also received on the gate terminals of P25 and N24 of keeper 232. While N24 is deactivated and P25 is activated responsive to the low on delay_1, dn nevertheless remains low. The low on dn is held by I13 and N27. Inverter I13 receives the low that results from the pull-down paths through N24 and the pull-down stack of N13 and N14 when these devices are active. Responsive to the low on its input, I13 outputs a high, which is received on the gate terminal of N27, thereby causing activation of that device. When active, N27 provides another path through which dn is pulled low. This low may continue to be held by I13 and N27 after the other devices providing respective pull-down paths are deactivated, up until a subsequent transition that causes dn to be pulled high.

Although not explicitly shown, the low-to-high transition of delay_2 (caused by a corresponding transition of the output node) results in NOR gate G5 providing a low on its output. As a result of the low on the output of G5, N12 is deactivated. Accordingly, the pull-down path through N11 and N12 is deactivated at this time. In the embodiment shown, the second delay time has a shorter duration than the first delay time. Accordingly, the pull-down path from dp to ground through N11 and N12 may be closed prior to delay 1 falling low and P21 activating to provide a pull-up path from dp to Vdd. This may in turn prevent contention between P21 and the combination of N11 and N12 when delay_1 falls low.

During the transition of the output node from low to high, storage element 25 may capture the new state responsive to the temporary low on dp. The new state (high) may be stored on node st, while a low is stored on node st_x. Node st_x in the embodiment shown is coupled to the input of inverter I3, which in turn is coupled to the output node. The equivalent of the output logic value may be stored on node st, while the complement of the output logic value may be stored on node st_x. Accordingly, even after P27 is deactivated, the low stored on node st_x is inverted by I3 and stored on the output node as a high. This high may remain stored on the output node of circuit 20 until a subsequent input transition causes the output node to fall low.

A high-to-low transition on data_a occurs in this example subsequent to the first pulse of the first clock signal, but prior to a second pulse. When the second pulse of the first clock signal occurs at (5), transistors P13 and P14 are activated. Transistor P14 is activated responsive to the low on node data_a, which is connected directly to its gate terminal. Transistor P13 is activated responsive to a low output by NAND gate G6. The output of G6 may fall low responsive logic highs on both of inputs (on delay_2, which resulted from the previous cycle, and from the high on clk_a). When both P13 and P14 are active, a pull-up path is provided between node dn and Vdd. Node dn is thus pulled high, which results in the activation of N28. When active, at (6), N28 provides a pull-down path from the output node to ground. Accordingly, the output node falls low.

When node dn is pulled high, the output of I13 changes from a high to a low. Accordingly, P26 is activated. Since delay_1 is low at this point, P25 is also active. With both P25 and P26 active, a second pull-up path between dn and Vdd is provided.

At the second delay time subsequent to the high-to-low transition of the output node, delay_2 falls low. When delay_2 falls low, the output of NAND gate G6 transitions high, thereby deactivating P13. This in turn removes the pull-up path from dn to Vdd through P13 and P14. At the first delay time subsequent to the output node falling low, delay_1 is driven high at (7), via the output of I23. When delay_1 transitions high, at (8), P25 is deactivated, thereby removing another pull-up path between dn and Vdd. Also responsive delay_1 transitioning high, N24 is activated to provide a pull-down path between dn and ground. Accordingly, when dn is pulled low, N28 is deactivated, and thus output circuit 24 discontinues driving the output node. The resultant low on dn is also enforced by I13 and N27. When the low from dn is input into I13, a high output to the gate of N27 results. The high on the gate of N27 results in its activation, thereby providing another pull-down path between dn and ground. The high is also received on the gate terminal of P26, which is deactivated as a result thereof.

During the time that dn is high (and thus, dn_x is low), storage element 25 captures and stores a low on st, while storing a high on st_x. The high on st_x is inverted by I3 to produce the low on the output node. This low continues to be held on the output node after N28 is deactivated, and may remain until a subsequent low-to-high transition of the input node causes dp to be pulled low.

In the example of FIG. 4, the first clock (received on clk_a) is inhibited at a point in time subsequent to the second pulse of the first clock signal, as indicated by the dashed line. Furthermore, the second clock signal (received on clk_b) is activated at this time. When inhibited, the first clock signal is held low in this embodiment. When active, the second clock signal will periodically transit high in a pulsed manner. Similar to the first clock signal, the second clock signal has less than a 50% duty cycle in this embodiment, although embodiments wherein the second clock signal does have a 50% (or greater) duty cycle are possible and contemplated.

The inhibiting of the first clock signal and the activation of the second clock signal in the embodiment shown in FIG. 3 enables circuit 20 to realize a multiplexer function. When the first clock signal is inhibited, all of N14, P11, P13, and N12 are held inactive. As a result, first input circuit 21 is inhibited from pulling either of nodes dp and dn low or high. Accordingly, the state of the signal received on data_a is illustrated here as being indeterminate.

At the beginning of the active state for the second clock signal, the second input signal, received on data_b, is low in this particular example. At a time subsequent to activation of the second clock signal, but before its first pulse, the second input signal transitions high. When the second clock signal subsequently transitions high at (9), node dp falls low. The low on dp results from the activation of transistors N15 and N16. When data_b transitions high, the high is received directly on the gate terminal of N15, thereby causing activation of that device. A high output from NOR gate G7 results in the activation of N16. When both N15 and N16 are active, a pull-down path is provided between node dp and ground. Transistors N17 and N18 are also active responsive to highs on their respective gate terminals, thus holding a low on dn.

At (10), the low on dp resulting from the high on data_b causes the activation of P27. The output node is pulled high when P27 is activated. The high is propagated into delay circuit 27, and thus after the first delay, at (11), delay_1 falls low. When delay 1 falls low, P21 is activated, and thus dp is pulled high at (12). When dp is pulled high, P27 is deactivated, and thus output stage 24 discontinues driving the output node. However, the high on the output node is held by I3 of storage element 25.

Subsequent to the low-to high transition of the output node but prior to the next low-to-high transition of the second clock signal, the input signal received at data_b falls low. When the second clock signal subsequently transitions high on clk_b, at (13), node dn is pulled high via a pull-up path through P17 and P18. The low on data_b is provided directly to the gate terminal of P18, thus activating that device. A low output from G8 causes the activation of P17, which receives as inputs the high from clk_b and another high from delay_2. Responsive to dn being pulled high, N28 is activated and thus pulls the output node low, at (14). Node dp is also pulled high at this time, responsive to lows provided to respective gate terminals of P15 and P16.

The low on the output node is provided as an input to delay circuit 27. At the first delay time subsequent to the output node falling low, delay_1 is pulled high, at (15). Responsive to delay_1 transitioning high, N24 is activated. When N24 is activated, node dn is pulled low, at (16). When dn is pulled low, N28 is deactivated and thus output circuit 24 discontinues driving the output signal. However, the output signal may remain low due to the output of I3.

Figure 5:
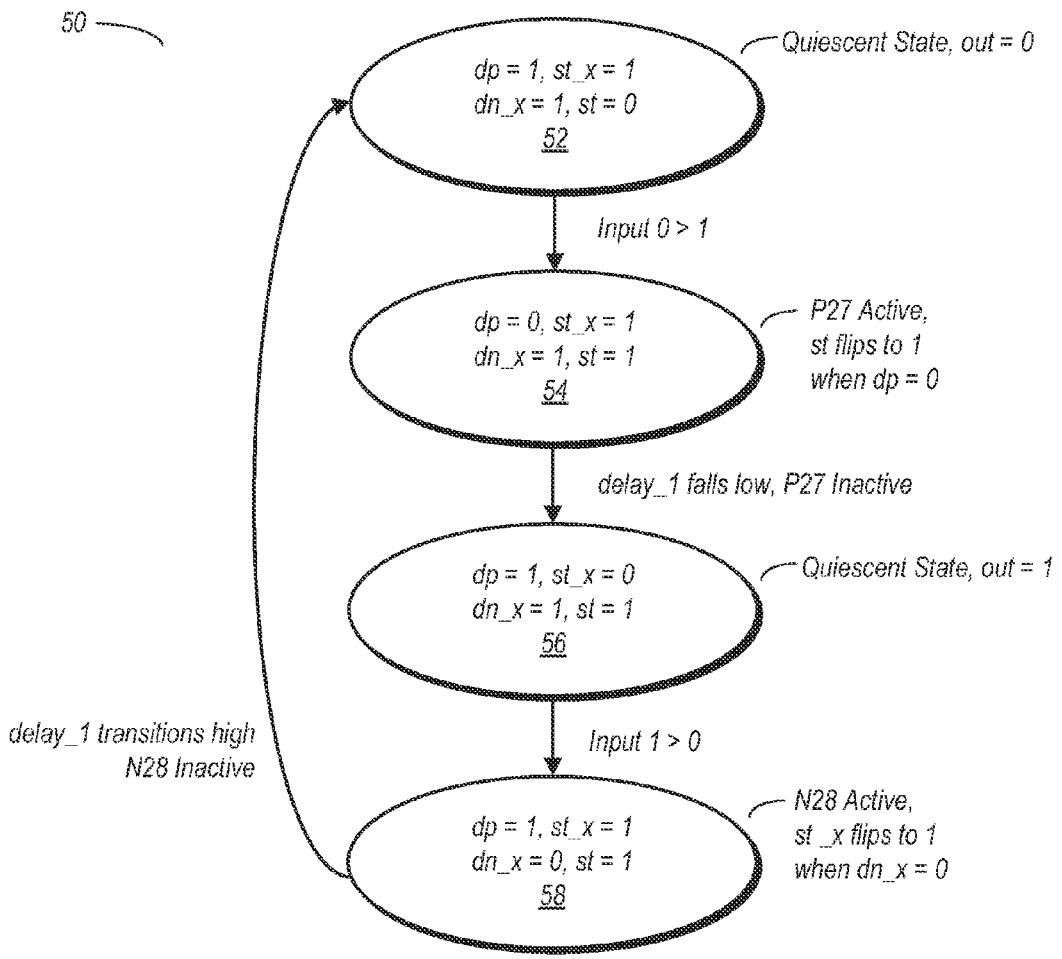
FIG. 5 is a state diagram illustrating operation of a state element in one embodiment of a circuit configured to implement a multiplexer, the state element, and a repeater.

The operation of storage element 25 during normal (i.e. non-scan) operations is now explained in conjunction with the state diagram of FIG. 5. State diagram 50 includes two quiescent states (states 52 and 56) and two transitional states (states 54 and 58). The quiescent states in this embodiment are those states to which storage element settles after output circuit 24 is deactivated responsive to either dp being pulled high or dn being pulled low. The transitional states in this embodiment are those states that occur when output circuit 24 is actively driving the output node. It is noted that when scan operations are not in progress (and thus si_clk is low in this embodiment), the outputs of NAND gates G1 and G2 are both logic high voltages (e.g., logic ones), and do not change with the other inputs to NAND gates G3 and G4 when a transition occurs. Accordingly, these inputs to NAND gates G3 and G4 are not considered in this example.

It is noted that in the discussion here, logic zeros are equated to logic lows, while logic ones are equated to logic highs. However, this description is not intended to be limiting. Accordingly, embodiments wherein a logic one is a low and a logic zero is a high are also possible and contemplated.

In the embodiment shown, node st, which is the output of G4 and an input to G3 is the logical equivalent of the output signal. Node st_x, which is the output of G3 and an input to G4 is a complement of both the output node and node st. Node dp is coupled to provide another input to G4. Node dn_x, a complement of node dn, is provided as an input to G3. The complement of node dn is produced by inverter I2, which is coupled between dn and dn_x.

In the embodiment shown, state 52 is a quiescent state with the output signal being low. In state 52, inputs dp and st_x to G4 are both logic ones. The output of G4, on node st, is thus a logic zero, and is input to G3. The other input to G3, from node dn_x, is a logic one. The output of G3 is thus a logic one, which is provided on node st_x, as well as to I3, which provides a logic 0 on its output.

A transition from state 52 to state 54 occurs when an input node of an active input circuit (e.g., data_a of first input circuit 21) changes from a logic zero to a logic one. When the input changes from a zero to a one, in conjunction with the required transition of the clock signal, node dp transitions from a logic one to a logic 0. Accordingly, the inputs to G4 in this state include a logic 0 for dp and a logic one for st_x. Responsive thereto, the output of G4, node st, changes ("flips") from a logic zero to a logic one. As a result, both inputs to G3 at this point are logic ones.

Entry into state 56 includes dp returning to a logic one responsive to delay_1 falling low at the first delay time subsequent to the transition of the output node from a logic 0 to a logic one. As noted above, the output node transition is accomplished at least in part by the activation of P27, which pulls the output node high. Delay_1 eventually falls low responsive to low-to-high transition of the output node, and thus dp is pulled up to a logic one as a result. Furthermore, the inputs to G3 in the previous state (state 54) were all logic ones, which thus causes st_x to change to a logic zero. Thus, in state 56, the inputs to G4, dp and st_x, are a logic one and a logic zero, respectively. The inputs to G3 are both logic ones in state 56, thereby producing the logic zero on st_x. State 56 is thus a quiescent state for a logic one output, as only a subsequent logic zero input can cause the state to change. A subsequent logic one input that occurs while in state 56 for circuit 20 as shown in FIG. 3 does not result in any change to either of nodes dp or do (and thus, d_x), and accordingly, state 56 is held for all subsequent logic one inputs that occur without any intervening logic zero inputs. Since the output of G4, node st, is logically equivalent to the state of the output node, the logic one produced on the output node responsive to the zero-to-one transition of the input node is stored by storage element 25. Furthermore, the logical complement of the output node is driven from the output of G3, node st_x, to the input of I3, which thus drives the output node to the required logic one in this particular state.

A transition from state 56 to state 58 in the embodiment shown may occur responsive to a logic one-to-zero transition on the input node of a selected input circuit. When this transition occurs, node dn is pulled high (thereby causing activation of N28), and node dn_x is correspondingly pulled low. The low on dn_x thus results in the inputs to G3 being a logic zero (dn_x) and a logic one (st). The output of G3, st_x, thus flips to a logic one as a result of the logic zero on dn_x. With N28 active, the output node is pulled low, to a logic zero. At the first delay time subsequent to the output node being pulled low, delay_1 transitions high, to a logic one. Responsive to the zero-to-one transition of delay_1, node dn is pulled low (with node dn_x correspondingly being pulled high), and N28 is deactivated. The state transitions accordingly, from state 58 back to state 52. The low received on the input is stored on node st and the output node, while the complement is stored on node st_x. This state is a quiescent state, and remains until a subsequent logic zero-to-one transition occurs on a data input of a selected input circuit.

As previously noted, circuit 20 may be configured for scan testing. In the embodiment of circuit 20 shown in FIG. 3, storage element 25 includes a scan data input ('sdi) and another input for receiving a scan input clock ('si_clk'). When in the scan mode, both dp and dn_x are logic ones, and thus the state of storage element 25 may be changed according to scan data received on sdi when the scan input clock signal is high. NAND gate G1 in the embodiment shown is coupled to receive as inputs the scan input data signal and the scan input clock. NAND gate G2 is also coupled to receive the scan input clock as an input, as well as a complement of the scan data input by way of inverter I1. When the scan input clock is high and a logic one received on the scan data input, G1 outputs a logic zero while G2 outputs a logic one. If a logic zero is received on the scan data input when the scan input clock is high, G1 outputs a logic one while G2 outputs a logic 0. When G1 outputs a logic zero and G2 outputs a logic one, G3 outputs a logic zero and G4 outputs a logic one. When G1 outputs a logic one and G2 outputs a logic zero, G3 outputs a logic one and G4 outputs a logic zero.

Storage element 25 is coupled to scan slave 26 via node st_x in the embodiment shown. In addition to having st_x as an input, scan slave 26 also includes an input for receiving a scan output clock. In one embodiment, the scan output clock may operate on an opposite phase than the scan input clock. When the scan output clock is high, passgate PG1 becomes transparent (due to the high scan output clock and its complement conveyed via I4), allowing the logic value present on st_x to be conveyed to the inverter that includes P1, P2, N1, and N2. This inverter is arranged to convey a logic value complementary to that received from st_x to a gated inverter that includes P3, P4, N3, and N4. This gated inverter is enabled when the scan output clock is high, thus activating N3 and P4 (via I4). A logic value equal to that received from st_x may be output by the gated inverter when enabled. A final inverter, I32, is arranged to provide the scan data output of scan slave 26. In this particular embodiment, the logic value of a signal conveyed on the scan data output is equivalent to that received on the scan data input during scan shifting operations. For example, if a logic one is received on sdi during scan shifting, a corresponding logic one may be provided on the scan data output. However, embodiments are possible and contemplated wherein a complement of the value received on sdi is provided on sdo during scan shifting operations.

In addition to enabling scan shifting, the scan functionality provided in circuit 20 may also enable the provision of test stimulus data to circuitry coupled to the output node, and the capture of test result data from circuitry coupled to the input data nodes of the input stages. As previously noted, storage element 25 is configured to provide a logic value on the output node via I3. Accordingly, test stimulus data may be loaded into storage element 25 and provided on the output node to circuitry coupled thereto. Furthermore, test stimulus data can be captured on the data input node of either of input stages 21 or 22 by cycling its respective clock signal during a test capture cycle. The captured test stimulus data may alter the state of one of intermediate nodes dp and dn, and thus be stored by storage element 25. Once captured, the test stimulus data may be output from scan slave 26 during scan shifting operations.

While circuit 20 and operation of its various functional units has been described above with reference to a specific embodiment, it is noted that this description is not intended to be limiting. Other embodiments are possible and contemplated, including embodiments having a different number of input stages (e.g., three or more), a differently configured intermediate stage, or a differently configured output stage (e.g., one having a staged output with multiple output devices for pull-up and pull-down operations). Such embodiments may fall within the scope of a circuit that implements a multiplexer function, a storage function, and a repeater function as described herein.

Integrated Circuit Embodiment

Figure 6:
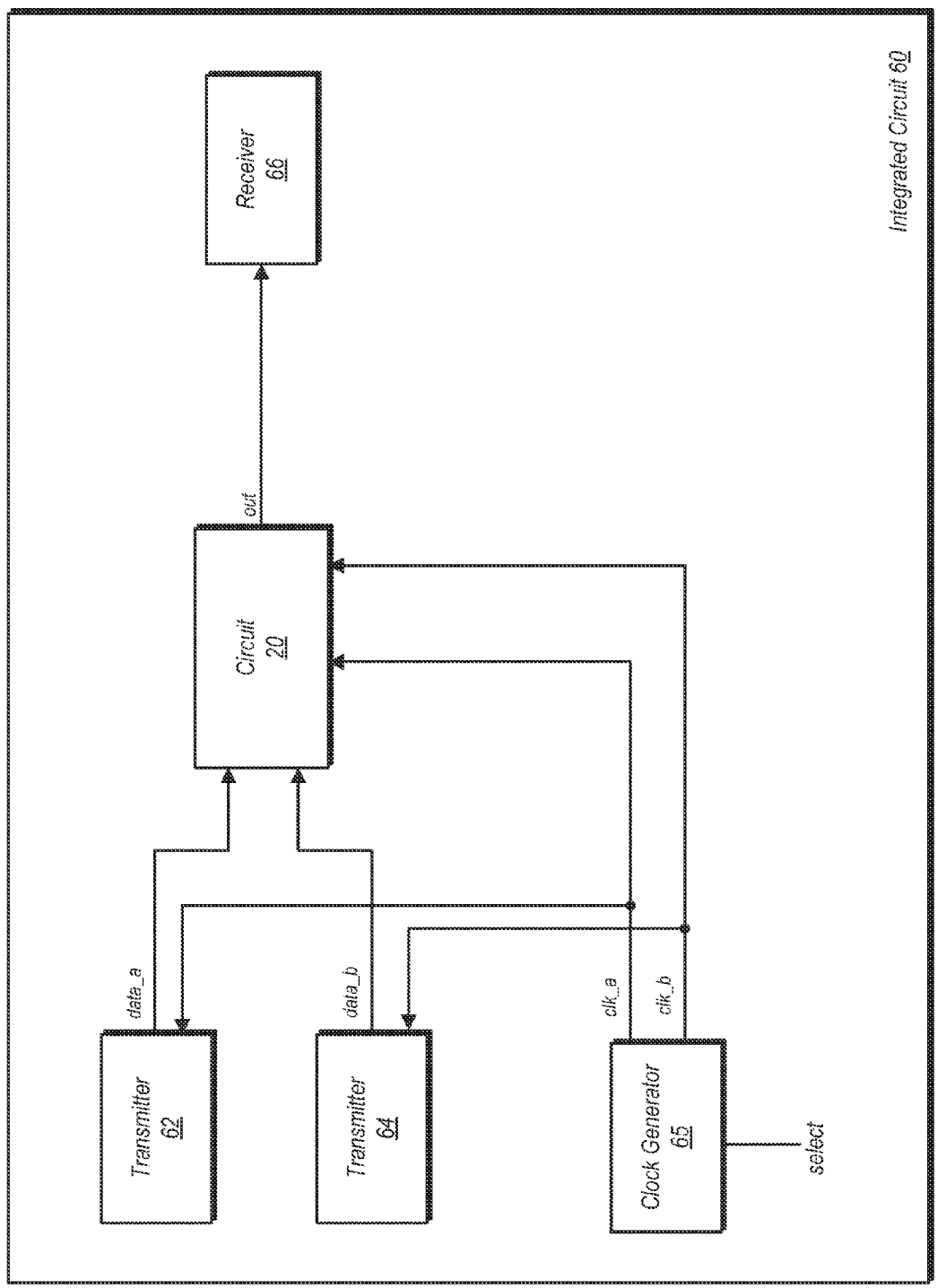
FIG. 6 is a block diagram of one embodiment of an integrated circuit.

FIG. 6 illustrates one embodiment of an integrated circuit (IC). It is noted that only those portions necessary to describe the operation of circuit 20 are shown in FIG. 6 for the sake of simplicity. Nevertheless, it is to be understood that IC 60 may have numerous other components in addition to those shown here, including additional instances of the components explicitly illustrated.

IC 60 in the embodiment shown includes a first transmitter 62, a second transmitter 64, a clock generator 65, circuit 20, and a receiver 66. Transmitter 62 is configured to transmit a data signal over data_a (i.e. a first signal path) to circuit 20 in accordance with a first clock signal conveyed on clk_a. Similarly, transmitter 64 is configured to transmit a data signal over data_b (i.e. a second signal path) in accordance with a second clock signal conveyed on clk_b. Clock generator 65 may receive a select signal and may enable one of the first or second clock signals based thereupon, while inhibiting the other clock signal.

Circuit 20 may be a circuit such as that shown in FIG. 3 that implements a multiplexer function, a storage function, and a dynamic repeater function. Circuit 20 may receive a signal from either data_a or data_b depending on which of the first and second clock signals is active. Thus, the multiplexer function may be implemented based on which clock signal is active, with the active clock signal effectively doubling as a select signal. The logic value of the received signal may be repeated and driven on the output node (i.e. a third signal path) to receiver 66 when the active clock signal is pulsed. Furthermore, circuit 20 may also store the logic value of the received signal on both the output node and in a storage element subsequent to deactivation of an output stage that is used in implementing the repeater function.

It is noted that in some embodiments, additional repeater circuits may be implemented in the various signal paths shown. These repeater circuits may or may not be dynamic repeater circuits, and may or may not include the storage function of circuit 20.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A circuit comprising:
    a first input stage having a first data input;
    a second input stage having a second data input;
    an output stage configured to, when active, drive an output signal on an output node, wherein the first input stage is configured to activate the output stage responsive to a first condition, and wherein the second input stage is configured to activate the output stage responsive to a second condition;
    to an intermediate stage coupled between the first and second input stages and the output stage, wherein the intermediate stage is configured to deactivate the output stage at a first delay time subsequent to one of the first or second input stages activating the output stage; and
    a storage element configured to store a state of the output signal, and further configured to cause the output node to be held at the state of the output signal subsequent to deactivation of the output stage.

2. The circuit as recited in claim 1, wherein the first input stage is configured to receive a first clock signal and wherein the second input stage is configured to receive a second clock signal, wherein the first condition includes a transition of the first clock signal, and wherein the second condition includes a transition of the second clock signal.

3. The circuit as recited in claim 1, further comprising a delay circuit having a delay input coupled to the output node, a first delay output coupled to the intermediate stage, and a second delay output coupled to each of the first and second input stages.

4. The circuit as recited in claim 3, wherein the delay circuit is configured to provide a complement of the output signal on the first delay output at the first delay time subsequent to activation of the output stage, and wherein the delay circuit is further configured to provide a delayed equivalent of the output signal on the second delay output at a second delay time subsequent to activation of the output stage.

5. The circuit as recited in claim 4, wherein the intermediate stage is configured to deactivate the output stage responsive to receiving the complement of the output signal from the delay circuit.

6. The circuit as recited in claim 4, wherein, subsequent to its activation, the first input stage is configured to be deactivated responsive to receiving the delayed equivalent of the output signal from the delay circuit, and wherein the second input stage, subsequent to its activation, is configured to be deactivated responsive to receiving the delayed equivalent of the output signal.

7. The circuit as recited in claim 1, wherein the first input stage, the second input stage, the storage element, and the output stage are each coupled to a first intermediate node and a second intermediate node.

8. The circuit as recited in claim 7, wherein the storage element includes first and second cross-coupled logic circuits, wherein, subsequent to deactivation of the output stage, the storage element is configured to hold the state of the output signal on a first storage node and further configured to hold a complement of the state of the output signal on a second storage node.

9. The circuit as recited in claim 1, wherein the circuit is configured to perform two logical inversions between the first data input and the output node, and wherein the circuit is further configured to perform two logical inversions between the second data input and the output node.

10. The circuit as recited in claim 1, further comprising a scan slave circuit coupled to receive a complement of the output signal and a scan output clock, wherein the scan slave circuit is configured to provide a scan data output signal having a state equivalent to the output signal when the scan output clock is active.

11. The circuit as recited in claim 10, wherein the storage element is configured to receive a scan data input signal and a scan input clock, wherein the storage element is configured to provide the complement of the scan data output signal to the scan slave element when the scan input clock is active.

12. The circuit as recited in claim 1, wherein the first input stage is configured to remain inactive when the first clock signal is inactive or inhibited, and wherein the second input stage is configured to remain inactive when the second clock signal is inactive or inhibited.

13. An integrated circuit comprising:
    a first transmitter configured to drive a first signal on a first signal path;
    a second transmitter configured to drive a second signal on a second signal path;
    a clock generation circuit, wherein the clock generation circuit is configured to selectively enable one of a first clock signal associated with the first transmitter and a second clock signal associated with the second transmitter; and
    a repeater circuit including:
        a first input stage coupled to receive the first signal from the first signal path;
        a second input stage coupled to receive the second signal from the second signal path;
        an output stage configured to, when active, drive an output signal on an output node, wherein the first input stage is configured to activate the output stage responsive to a transition of the first clock signal, and wherein the second input stage is configured to activate the output stage responsive to a transition of the second clock signal;
        an intermediate stage coupled to the output stage, wherein the intermediate stage is configured to deactivate the output stage at a first delay time subsequent to one of the first or second input stages activating the output stage; and
        a storage element configured to store a state of the output signal, and further configured to cause the output node to be held at the state of the output signal subsequent to deactivation of the output stage.

14. The integrated circuit as recited in claim 13, wherein the repeater circuit further includes a delay circuit having a delay input coupled to the output node, a first delay output coupled to the intermediate stage, and a second delay output coupled to each of the first and second input stages, wherein the delay circuit is configured to provide a complement of the output signal on the first delay output at the first delay time subsequent to activation of the output stage, and wherein the delay circuit is further configured to provide a delayed equivalent of the output signal on the second delay output at a second delay time subsequent to activation of the output stage.

15. The integrated circuit as recited in claim 14, wherein the intermediate stage is configured to deactivate the output stage responsive to receiving the complement of the output signal from the delay circuit.

16. The integrated circuit as recited in claim 14, wherein, subsequent to its activation, the first input stage is configured to be deactivated responsive to receiving the delayed equivalent of the output signal from the delay circuit, and wherein the second input stage, subsequent to its activation, is configured to be deactivated responsive to receiving the delayed equivalent of the output signal.

17. The integrated circuit as recited in claim 13, wherein the first input stage, the second input stage, the storage element, and the output stage are each coupled to a first intermediate node and a second intermediate node.

18. The integrated circuit as recited in claim 17, wherein the storage element includes first and second cross-coupled logic circuits, wherein, subsequent to deactivation of the output stage, the storage element is configured to hold the state of the output signal on a first storage node and further configured to hold a complement of the state of the output signal on a second storage node.

19. The integrated circuit as recited in claim 13, wherein the repeater circuit is configured to perform two logical inversions between the first data input and the output node, and wherein the circuit is further configured to perform as two logical inversions between the second data input and the output node.

20. The integrated circuit as recited in claim 13, further comprising a receiver circuit coupled to receive the output signal from the repeater circuit via a third signal path.

* * * * *

UNITED STATES PATENT AND TRADEMARK OFFICE
CERTIFICATE OF CORRECTION

| | |
|---|---|
| PATENT NO. | : 8,525,550 B2 |
| APPLICATION NO. | : 12/908167 |
| DATED | : September 3, 2013 |
| INVENTOR(S) | : Robert P. Masleid et al. |

It is certified that error appears in the above-identified patent and that said Letters Patent is hereby corrected as shown below:

Title Page, Item (73) Assignee should read:

Oracle International Corporation 500 Oracle Parkway, Redwood Shores, CA 94065

Signed and Sealed this
Fourteenth Day of January, 2014

Michelle K. Lee
*Deputy Director of the United States Patent and Trademark Office*